United States Patent [19]

Ribner

[11] Patent Number: 5,047,772
[45] Date of Patent: Sep. 10, 1991

[54] DIGITAL ERROR CORRECTION SYSTEM FOR SUBRANGING ANALOG-TO-DIGITAL CONVERTERS

[75] Inventor: David B. Ribner, Schenectady, N.Y.

[73] Assignee: General Electric Company, Schenectady, N.Y.

[21] Appl. No.: 533,263

[22] Filed: Jun. 4, 1990

[51] Int. Cl.$^5$ .................... H03M 1/44; H03M 1/10
[52] U.S. Cl. .................... 341/156; 341/161; 341/120; 341/118
[58] Field of Search ............ 341/161, 120, 118, 156, 341/162, 155

[56] References Cited

U.S. PATENT DOCUMENTS

| | | | |
|---|---|---|---|
| 4,612,533 | 9/1986 | Evans | 341/156 X |
| 4,894,656 | 1/1990 | Hwang et al. | 341/120 |
| 4,903,023 | 2/1990 | Evans et al. | 341/120 |
| 4,903,026 | 2/1990 | Tiemann et al. | 341/131 |
| 4,908,621 | 3/1990 | Polonio et al. | 341/161 X |
| 4,947,168 | 8/1990 | Myers | 341/161 X |

OTHER PUBLICATIONS

A. Dingwall et al., "An 8-MHz CMOS Subranging 8-bit A/D Converter," IEEE J. Solid-State Circuits, vol. SC-20, pp. 1138-1143, Dec. 1985.
S. Lewis et al., "A Pipelined 5-Msample/s 9-bit Analog-to-Digital Converter," IEEE J. Solid-State Circuits, vol. SC-22, No. 6, pp. 954-961, Dec. 1987.
S. Boyacigiller et al., "An Error Correcting 14b/20 μs CMOS A/D Converter," ISSCC Dig. Tech. Papers, pp. 62-63, Feb. 1981.
B. Widrow et al., "Adaptive Signal Processing", Prentice-Hall, Inc., pp. 99-114, (1985).

Primary Examiner—J. R. Scott
Assistant Examiner—Sharon D. Logan
Attorney, Agent, or Firm—Marvin Snyder; James C. Davis, Jr.

[57] ABSTRACT

A general architecture to correct conversion errors of a multi-stage, pipelined subranging analog-to-digital (A/D) converter includes cascaded stages, each stage generating a binary conversion signal representing the nearest quantized level below that of the analog input signal and a residual analog signal applied to the next conversion stage. The binary conversion signal from each stage addresses individual or common look-up tables providing a compensated binary signal selected to compensate for nonidealities of the A/D converter components. The compensated binary signals from the look-up tables provide a corrected output signal when summed together. A simple method of calibration for the A/D converter makes use of a least-mean-squared adaptation algorithm. The A/D converter accommodates practical circuit nonidealities such as component mismatching, gain error and voltage offsets, and handles high levels of amplifier nonlinearity. The architecture is applicable to any subranging converter with arbitrary numbers of stages and bits per stage.

22 Claims, 7 Drawing Sheets

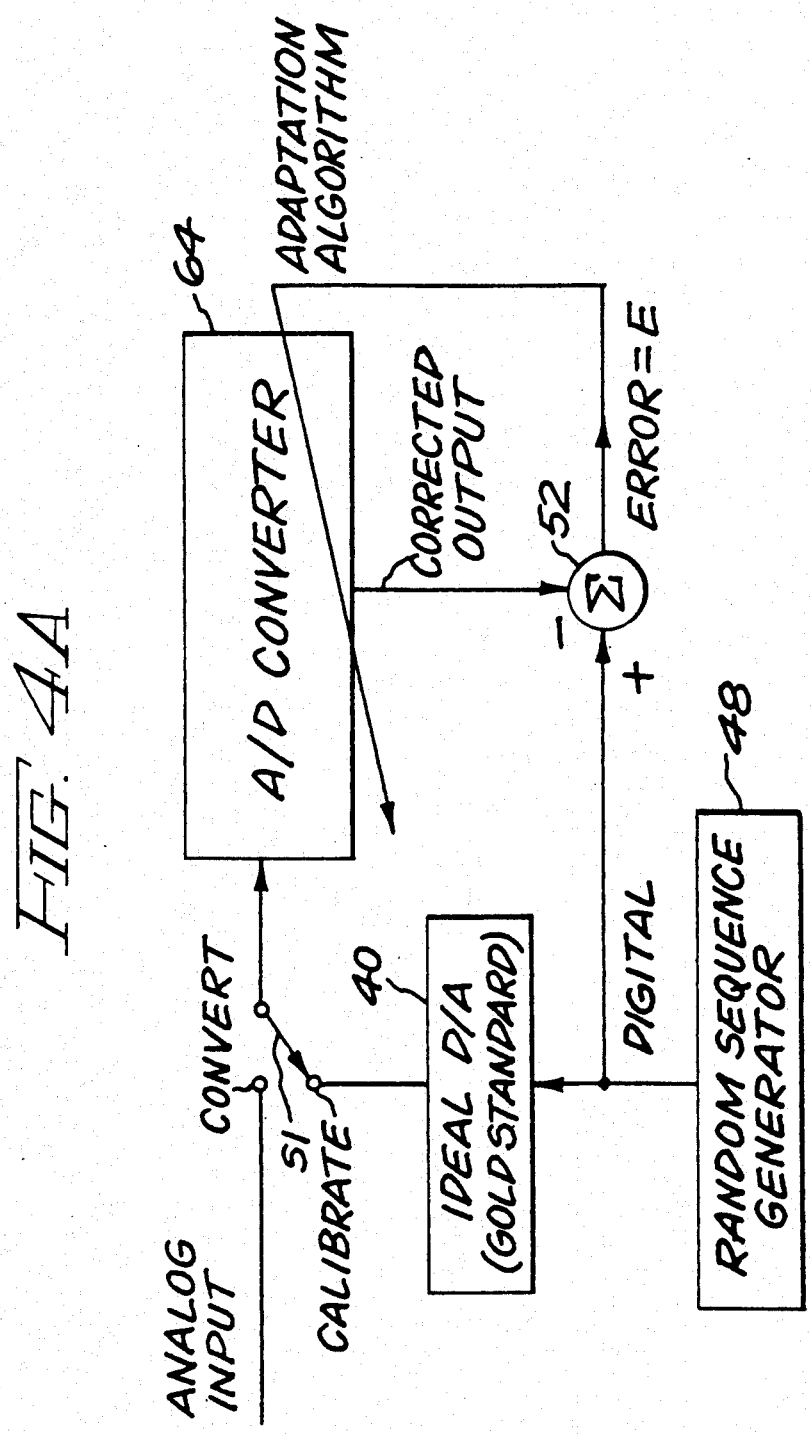

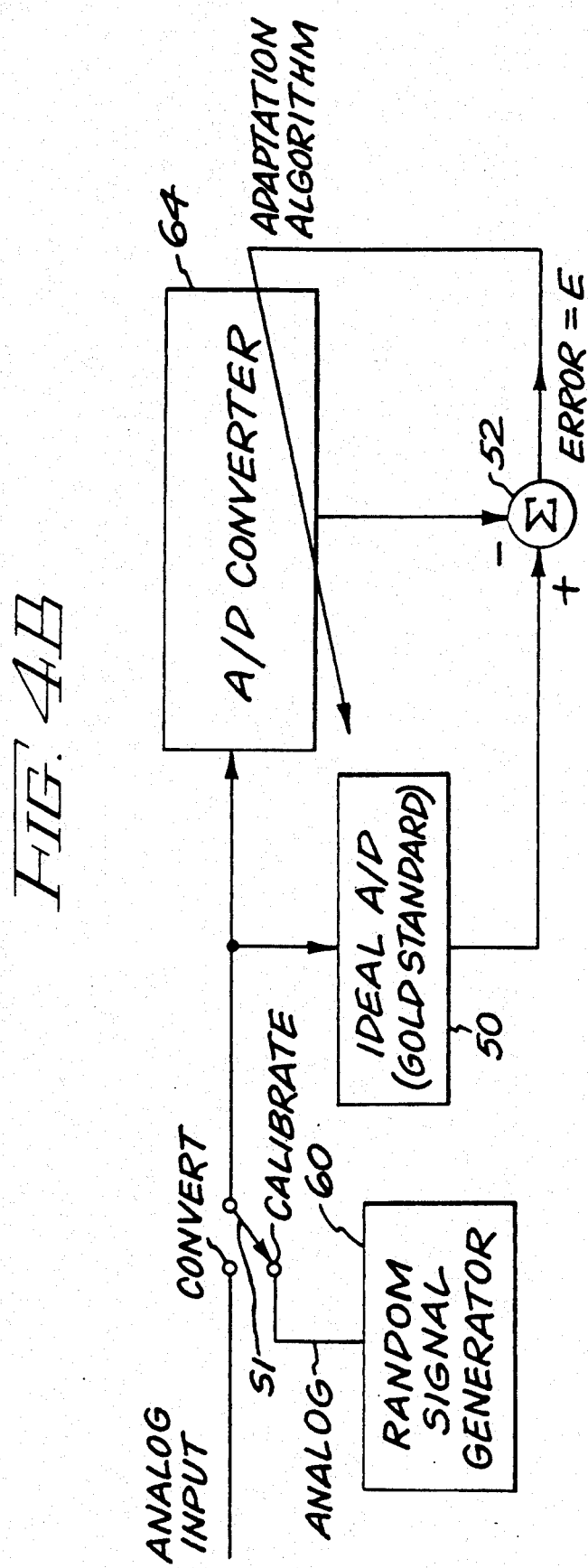

DIGITAL ERROR CORRECTION SYSTEM FOR SUBRANGING ANALOG-TO-DIGITAL CONVERTERS

BACKGROUND OF THE INVENTION

1. Field of the Invention

The present invention generally relates to multi-stage, pipelined subranging analog-to-digital converters and, more particularly, to a system for correcting conversion errors in multi-stage pipelined, subranging analog-to-digital converters.

2. Description of the Prior Art

A subranging analog-to-digital converter is described by A.G.F. Dingwall and W. Zazzu in "An 8-MHz CMOS Subranging 8-Bit A/D Converter", *IEEE J. Solid-State Circuits*, Vol. SC-20, pp. 1138–1143, December 1985, and S.H. Lewis and P.R. Gray in *IEEE J. Solid-State Circuits*, Vol. SC-22, No. 6, pp. 954–961, December 1987.

In the so-called "digital correction" method described by S.H. Lewis and P.R. Gray, supra, the interstage gain is made one half of the conventional amount, i.e., $2^{L-1}$ for a stage that uses L-bit analog-to-digital (A/D) and digital-to-analog (D/A) converters. The residual signal thus spans only half of the range of the subsequent stage. In this circumstance, errors in the A/D converter of any stage, up to $\pm\frac{1}{2}$ of a least significant bit (LSB), can be accommodated. Such errors will cause the amplified residual signal to fall either above or below the expected range and can be corrected by either incrementing or decrementing the L-bit A/D converter code for the prior stage respectively. Although this method is very simple, it cannot correct any error in the D/A converter, or in the gain stage, and it is not sufficient for high resolution (i.e., resolution above 9 bits).

Use of a radix 1.85, instead of radix 2, along with digital coefficients to implement a corrected output signal is also known. This technique is described by S.G. Boyacigiller et al. in "An Error Correcting 14b/20μs CMOS A/D Converter", *ISSCC Dig. Tech. Papers*, pp. 62–63, February 1981. This approach is capable of correcting for component matching errors and gain errors. However, its inability to accommodate any nonlinearity in the gain stages or elsewhere limits its practicality in implementing high resolution converters.

Subranging analog-to-digital converters are attractive for high-speed operation since they are almost comparable in speed to a flash converter, but use far less hardware. For example, an N-bit flash converter makes use of $2^N-1$ comparators, while the same resolution in an L stage subranging architecture requires only $L(2^{N/L}-1)$ comparators. Unfortunately, efforts to obtain high resolution are hampered by practical circuit nonidealities such as component mismatching, nonlinearity, offset, noise, etc. In the case of a subranging A/D converter in particular, accuracy is limited by the degree of linearity of the A/D and D/A converters in the first stage. Resolution at accuracy levels beyond the limits of the nonideal components mentioned above, however, is obtainable by use of this invention.

SUMMARY OF THE INVENTION

One object of the invention is to provide a multi-stage, pipelined subranging analog-to-digital converter which can be readily calibrated to compensate for nonidealities of its components.

Another object is to provide a digital error correction system which facilitates calibration of a subranging analog-to-digital converter to avoid errors in the operation of the converter.

Another object is to facilitate high resolution analog-to-digital conversion with a subranging architecture.

The invention provides an improved approach to the implementation of high resolution analog-to-digital converters. The intent is to use digital techniques as much as possible to mitigate the effects of component mismatches and nonlinearities that otherwise limit resolution to a lower level. The architecture which supports a digitally correctable A/D converter is consistent with general subranging architectures so as to be efficient in terms of required chip area and power dissipation. The architecture is also amenable to pipelining for high-speed operation, and uses a limited number of digital coefficients to implement the correction of the circuit nonidealities. Application of the invention is intended to enable analog-to-digital conversion to take place with accuracy levels considerably beyond the limits imposed by circuit nonidealities or impairments. It is contemplated that 16-bit resolution at conversion rates of upwards of 25 MHz, well beyond the present state of the art, can be obtained from standard integrated circuit technologies using the present invention.

A general architecture to correct conversion errors of a multi-stage pipelined, subranging analog-to-digital converter is provided. The converter includes a plurality of conversion stages connected in cascade, each stage including a sample-and-hold circuit, an analog-to-digital converter for converting an analog input signal into a binary conversion signal which corresponds to the nearest quantized level below that of the analog input signal, a digital-to-analog converter for converting the binary conversion signal into a quantized analog signal which corresponds to the nearest quantized level below that of the analog input signal, summation means for subtracting the quantized analog signal from the analog input signal to generate a residual analog signal, and a gain amplifier which amplifies the residual analog signal for application to the next conversion stage. In each stage, the binary conversion signal addresses an individual look-up table to provide a compensated binary signal which is selected to compensate for nonidealities of the converter components. The compensated binary signals from the look-up tables provide a corrected output signal when combined or summed together. In another embodiment, the binary conversion signal in the stages for the most significant bits address a common look-up table, while each of the remaining stages addresses a respective individual look-up table.

A simple method of calibration, which makes use of a least-mean-squared adaptation algorithm, is also provided. This technique accommodates practical circuit nonidealities such as component mismatching, gain error and voltage offsets, and also handles high levels of amplifier nonlinearity. The architecture of the invention is applicable to any subranging converter with an arbitrary number of stages and number of bits per stage.

BRIEF DESCRIPTION OF THE DRAWINGS

The foregoing and other objects, aspects and advantages will be better understood from the following detailed description of a preferred embodiment of the invention with reference to the drawings, in which:

FIGS. 4A and 4B are block diagrams which illustrate calibration techniques for the analog-to-digital converter in accordance with the invention;

DETAILED DESCRIPTION OF A PREFERRED EMBODIMENT OF THE INVENTION

Figure 1:
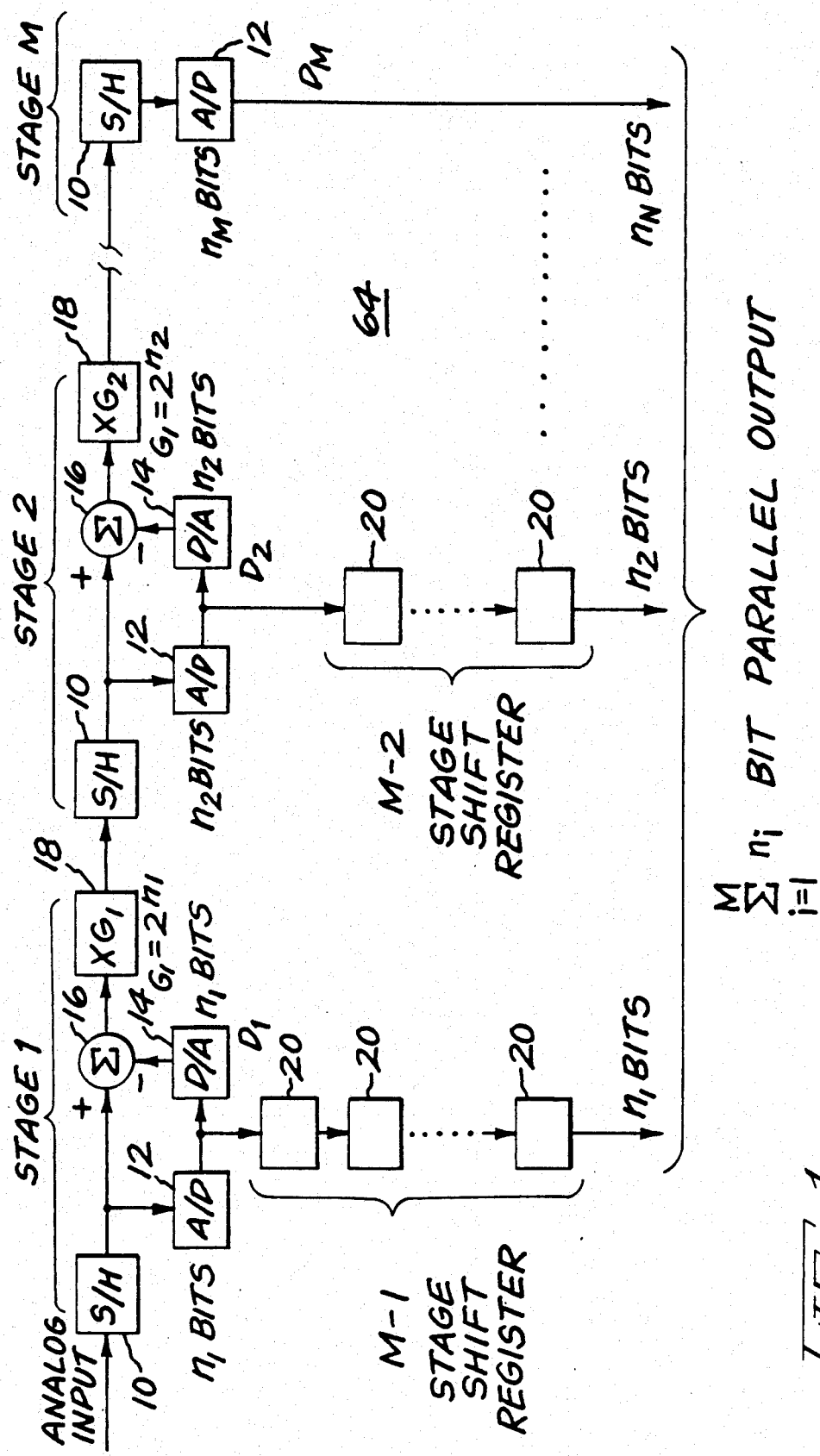
FIG. 1, is a block diagram illustrating a basic subranging pipelined analog-to-digital converter architecture known in the prior art.

A block diagram of a basic subranging converter, as known in the prior art, is shown in FIG. 1. The converter comprises two or more similar conversion stages (1, 2, ... M) connected together in a cascade arrangement. Each conversion stage includes a sample-and-hold (S/H) circuit 10 to which an analog input signal is applied. Each stage uses a low resolution A/D converter 12 to generate a binary conversion signal corresponding to the nearest quantized level below that of the analog input signal applied to sample-and-hold circuit 10 of that stage, while a companion D/A converter 14 generates a quantized analog signal corresponding to the nearest quantized level below that of the analog input signal applied to the sample-and-hold circuit 10 of that stage. This quantized analog signal in each stage is subtracted from the analog input signal in that stage by a summation circuit 16 which generates a residual analog signal that is less than one LSB of the digital-to-analog converter 14 in that stage. A subsequent gain amplifier 18 in each stage boosts the residual signal in that stage back to a level consistent with the input range of the next stage. Thus each stage digitally approximates its analog input signal and passes the remainder of that analog signal (after amplification) on to the following stage for further processing. Normally, design dictates that the interstage gain be $2^L$ for a stage with an L-bit A/D and D/A converter to boost the residual signal up to the full scale level of the following stage.

In pipelined operation, the signal processed by each stage is delayed from the preceding stage by one sample period. Thus a latency of M clock cycles is required before an output signal is available from the final stage. The output signals of earlier stages are available sooner and must be delayed accordingly before being combined into a single output signal. This is implemented, as shown in FIG. 1, by advancing the binary conversion signal from the analog-to-digital converter 12 of each conversion stage through a plurality of stages 20 of a shift register in each conversion stage. The shift register in each successive conversion stage has one less stage 20 than the shift register of the previous conversion stage, except for the final conversion stage which employs no shift register. The parallel outputs from each conversion stage are combined to produce a resultant binary output signal which represents the analog input signal to the multi-stage analog-to-digital converter.

Figure 2:
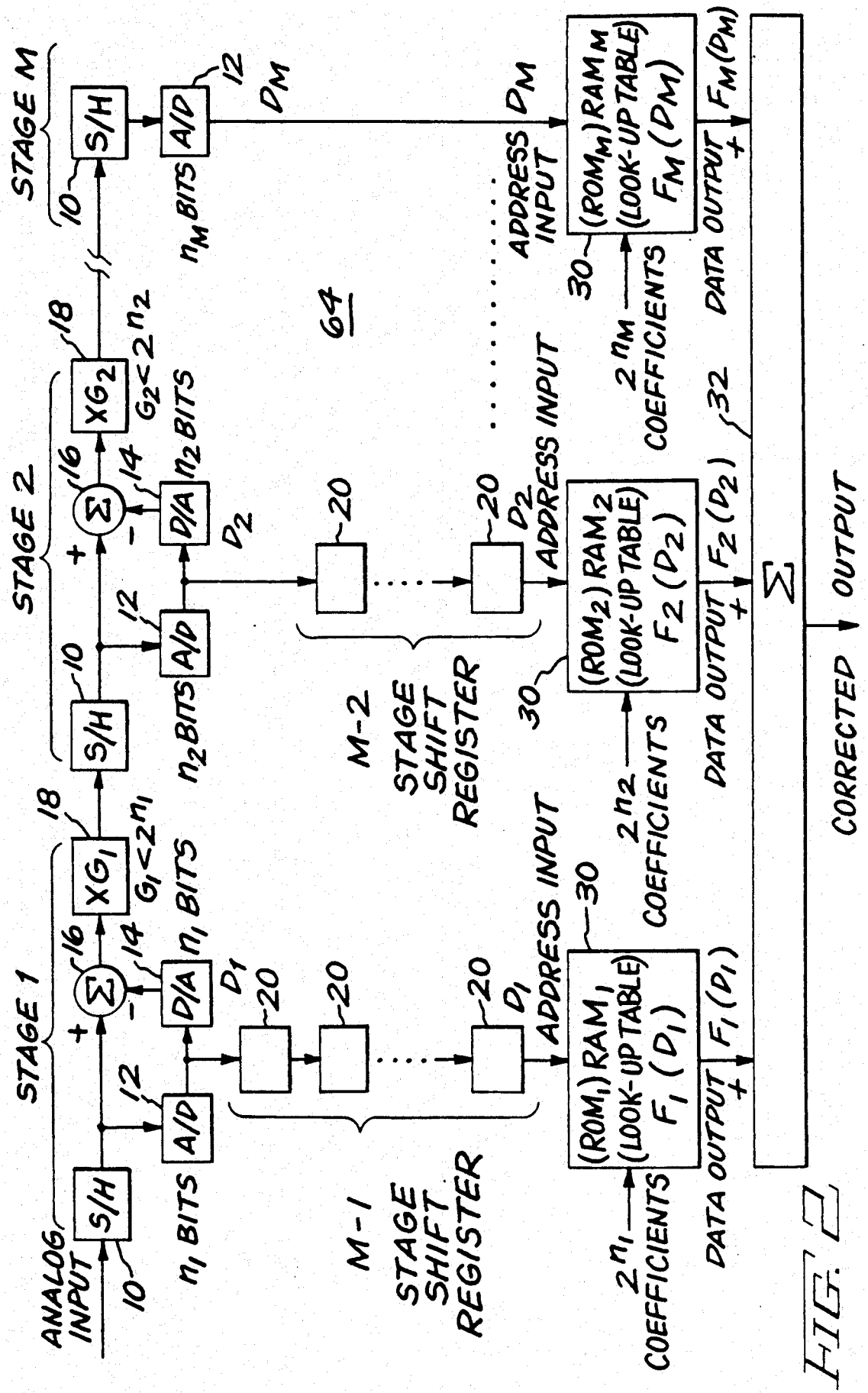
FIG. 2 is a block diagram illustrating a correctable subranging pipelined analog-to-digital converter in accordance with the present invention.

The architecture of multi-stage analog-to-digital converter 64, shown in FIG. 2, is an improvement of the subranging architecture of FIG. 1 discussed above. The improved architecture comprises the basic pipelined subranging structure of FIG. 1 along with individual digital look-up tables 30 for each of the conversion stages (1, 2, ... M). To perform a corrected conversion, the M sets of uncorrected digital output signals $D_i$, $1 \leq i \leq M$, of the M subranging stages address the respective M look-up tables 30. The M output signals $F_i(D_i)$, $i = 1, \ldots, M$, of look-up tables 30 are combined in a summation unit 32 to produce a corrected result. In general, each look-up table 30 implements an arbitrary discrete valued nonlinear function of its digital input signal. A method to calibrate the converter, i.e., to incorporate the required coefficients into the look-up tables, is described below.

Each look-up table 30 can be constructed as either a read only memory (ROM) or a random access memory (RAM), depending on the desired calibration method. Each look-up table 30 has a number of binary address inputs equal to the number of bits of the A/D converter 12 for its respective stage, i.e., $n_i$ binary address inputs for any stage i in FIG. 2, and thus have $2^{n_i}$ coefficients. The binary word size of these coefficients, in any stage, is greater than the total number of bits of A/D converter 12 in that stage, to facilitate correction and calibration.

In a manner somewhat analogous to the correction schemes discussed in connection with the prior art, the interstage amplifiers 18 have gains of less than what is required for a conventional subranging analog-to-digital converter. Referring to the prior art architecture of FIG. 1, the interstage amplifier gains without correction are $$G_i = 2^{n_i}; \ 1 \leq i \leq M \tag{1}$$

However, in the architecture of FIG. 2, the gains of the gain amplifiers 18 and sample-and-hold circuits 10 are reduced to accommodate errors in the interstage A/D and D/A converters, i.e., $$G_i < 2^{n_i}; \ 1 \leq i \leq M \tag{2}$$

A practical choice of gain is that used in the digital correction method $$G_i < 2^{n_i - 1}; \ 1 \leq i \leq M. \tag{3}$$

The actual gain values chosen could be greater or less than these amounts, depending on the expected values of errors.

Making the gains as high as possible provides more output bits for a given number of stages. For example, an uncorrected converter, with M stages and gains specified by Equation 1 has a number of output bits (ignoring nonidealities)

$$n_{Tot} = \sum_{i=1}^{M} n_i \tag{4}$$

If, however, the analog-to-digital converter uses the gains of Equation 3, then the number of output bits is $$n_{Tot} = \sum_{i=1}^{M} n_i - (M-1). \qquad (5)$$

Thus the number of output bits depends on the choice of interstage amplifier gains.

The required number of coefficients as determined by the number of stages in the multi-stage analog-to-digital converter, and the number of bits per stage is $$n_{Coef} = \sum_{i=1}^{M} 2^{n_i} \qquad (6)$$

As an example, a three-stage pipeline with $n_1=n_2=5$, $n_3=4$ and $G_1=G_2=16$ has 14 uncorrected bits resulting from its analog input signal, requires 80 coefficients, and produces a 12-bit corrected output signal. Each coefficient requires a word size of approximately 16 bits to allow for averaging in the calibration algorithm, and the total memory requirement is 1280 bits.

Figure 3:
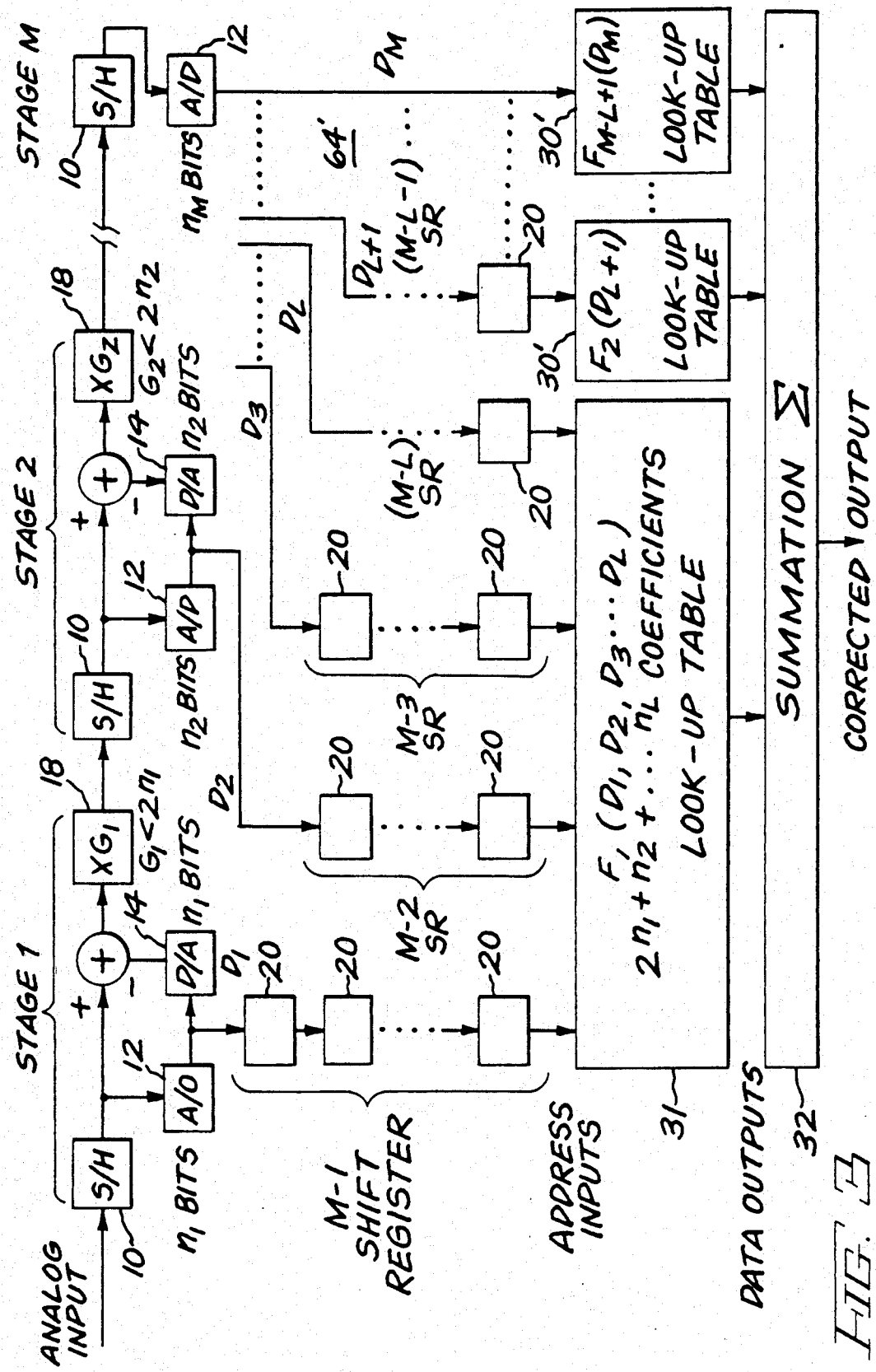
FIG. 3 is a block diagram showing a variation of the correctable subranging pipelined analog-to-digital converter of FIG. 2 in accordance with another aspect of the invention.

A variation 64' of the pipelined multi-stage analog-to-digital converter is shown in FIG. 3 wherein like reference numerals indicate the same (or corresponding) elements as in FIG. 2. In FIG. 3, instead of a separate look-up table 30 for each pipeline stage, a single look-up table 31 is used for the most significant bits (MSBs) corresponding to $D_L$ output signals of the first L stages. Separate look-up tables 30' are used for each of the remaining stages. The required number of coefficients in this implementation increases to $$n_{Coef} = 2^{n_1+n_2+\ldots nL} + \sum_{i=L+1}^{M} 2^{n_i}. \qquad (7)$$

It is desirable to keep the number of stages L connected to the first look-up table 31 as small as possible to minimize the number of coefficients.

Types of Correctable Errors

All static matching, gain and offset errors are completely corrected, including substage A/D and d/A converter nonlinearities. Static nonlinearities of gain amplifiers and summers are not corrected explicitly for the converter 64 of FIG. 2, but basically a best fit (in a least-mean-squared sense) in the presence of these impairments is obtained. Nonlinearities also are inherently attenuated by their input-referred gain in this architecture. For instance, the 3-stage 12-bit converter in the example above is very tolerable to nonlinearities between stages. The first stage attenuates any nonlinear summation or gain error at its output by a factor of $2^5=32$. A simulated version of this configuration obtained 12-bit accuracy despite 2% nonlinearities in the gain stages. The A/D converter implementation 64' of FIG. 3 uses a larger total number of digital coefficients to enable it to correct more accurately for errors due to static nonlinearities. The number of stages L incorporated together as inputs to the first table in A/D converter 64' governs the degree of nonlinearity that is correctable therein. In general, the smallest number of stages that provides acceptable nonlinearity correction should be used in order to reduce the total number of table coefficients required. Nonlinearity in subsequent stages L+1 to M are not corrected; however, their effects are attenuated by their input-referred gains as mentioned earlier.

In addition, dynamic errors linked to settling time behavior are correctable. If the sizes of these errors change significantly, however, due to variation in power supply or temperature, for instance, then the converter may need to be periodically recalibrated.

Calibration

Calibration can be done in various ways depending on the application. For example, a general approach that uses a least-mean-squared (LMS) adaptive algorithm is described by B Widrow and S.D. Stearns in *Adaptive Signal Processing*, Prentice-Hall, 1985, pp. 99-114. Two examples, shown in FIGS. 4A and 4B, use an ideal (in relation to the specific application), so-called "gold standard", converter to generate what is termed an "exact" output and use LMS adaptation of the look-up table coefficients. In actual practice, the "gold-standard", or reference, converter needs to be only one order of magnitude (or less) better in accuracy than the objective specification for the analog-to-digital converter after calibration. For example, to obtain 12-bit resolution after calibration, a 14-bit "gold-standard" converter is adequate. The techniques shown in FIGS. 4A and 4B differ only in that a digital-to-analog converter 40 is used as the "gold standard" reference in FIG. 4A whereas an analog-to-digital converter 50 is used in FIG. 4B. The use of the D/A converter standard is probably the most practical approach to implement since it is usually easier to make a high precision D/A converter than an A/D converter.

Both approaches operate as follows. An error, based on the difference between the digital version of the ideal random input signal and the corrected output signal, is calculated. The error is then used to update the appropriate coefficient of each table. Denoting the $n^{th}$ value of the coefficient of the $i^{th}$ stage addressed by the $n^{th}$ value of the binary input $D_i^n$ as $F_i^n(D_i^n)$, and considering each look-up table as a block of binary memory, then $F_i(D_i)$ is the output signal of memory block i addressed by input $D_i$ and superscript n designates the iteration number, in time, of $F_i(\ )$ and $D_i$. The table look-up LMS algorithm is $$F_i^{n+1}(D_i^n) = F_i^n(D_i^n) + \gamma \epsilon_n; \ 0 < i \leq M \qquad (8)$$

for the A/D converter 64 of FIG. 2 and $$F_1^{n+1}(D_1^n, D_2^n \ldots D_L^n) = F_1^n(D_1^n, D_2^n \ldots D_L^n) + \gamma \epsilon_n \qquad (9)$$

$$F_i^{n+1}(D_i^n) = F_i^n(D_i^n) + \gamma \epsilon_n; \ 2 \leq i \leq M-L+1$$

for the A/D converter 64' of FIG. 3, where $\epsilon_n$ is the error after the $n^{th}$ iteration, and $\gamma$ is the convergence coefficient, usually a constant, and normally $\gamma \ll 1$. Table $F_1(D_1, D_2 \ldots D_L)$ designates a memory block with an output selected by the concatenation of address bits $D_1$ through $D_L$. The word size of the table coefficients should be greater than the desired number of bits to allow for $\gamma < 1$. In this algorithm, only the coefficient from each table that was used in forming the $n^{th}$ output is updated at each iteration. Speed of adaptation therefore drops with respect to the size of tables that are used, i.e., the more coefficients per table, the longer it takes to converge since only one coefficient per table is adjusted on each conversion. Other adaptation algorithms may be used if appropriate.

In the calibration technique used with the system of FIG. 4A, a random sequence generator 48 applies a random binary signal to an ideal ("gold standard") digital-to-analog converter 40. The binary signal is converted into an analog signal which is applied via a switch S1 to the input of the multi-stage analog-to-digital converter 64. A digital subtractor 52 computes the difference between the binary signal from random sequence generator 48 and the binary output signal produced by summation unit 32 (shown in FIGS. 2 and 3) and produces an error signal $\epsilon$ representing the difference between the binary signals. The error signal $\epsilon$ is applied to a processor (not shown) which performs an adaptation algorithm and returns a corrected coefficient to each of the look-up tables of multi-stage analog-to-digital converter 64. It should be noted that the foregoing description of operation of the system of FIG. 4A is the same if analog-to-digital converter 64' (of FIG. 3) is substituted for analog-to-digital converter 64 (of FIG. 2).

In the calibration technique used with the system of FIG. 4B, a random signal generator 60 applies a random analog signal via a switch S1 to an ideal ("gold standard") analog-to-digital converter 50 and to the input of multi-stage analog-to-digital converter 64. A digital subtractor 62 computes the difference between the binary signal produced by the "gold standard" analog-to-digital converter 50 and the binary output signal from summation unit 32 (shown in FIGS. 2 and 3) and produces an error signal $\epsilon$ representing the difference between the binary signals. The error signal $\epsilon$ is applied to a processor (not shown) which performs an adaptation algorithm and returns a corrected coefficient to each of the look-up tables of multi-stage analog-to-digital converter 64. It should be noted that the foregoing description of operation of the system of FIG. 4B is the same if analog-to-digital converter 64' (of FIG. 3) is substituted for analog-to-digital converter 64 (of FIG. 2).

Hardware for Calibration

With an appropriate set of coefficients stored in their look-up table memories, the A/D converters of the invention operate properly and correct errors for high accuracy. The A/D converters can be calibrated during manufacture and the coefficients can be stored in the correction memory of the A/D converters for later use. In this circumstance, the A/D converter itself does not require calibration hardware, thereby avoiding this complexity and the costs associated therewith, and consists only of the circuitry shown in either FIG. 2 or FIG. 3.

Figure 5:
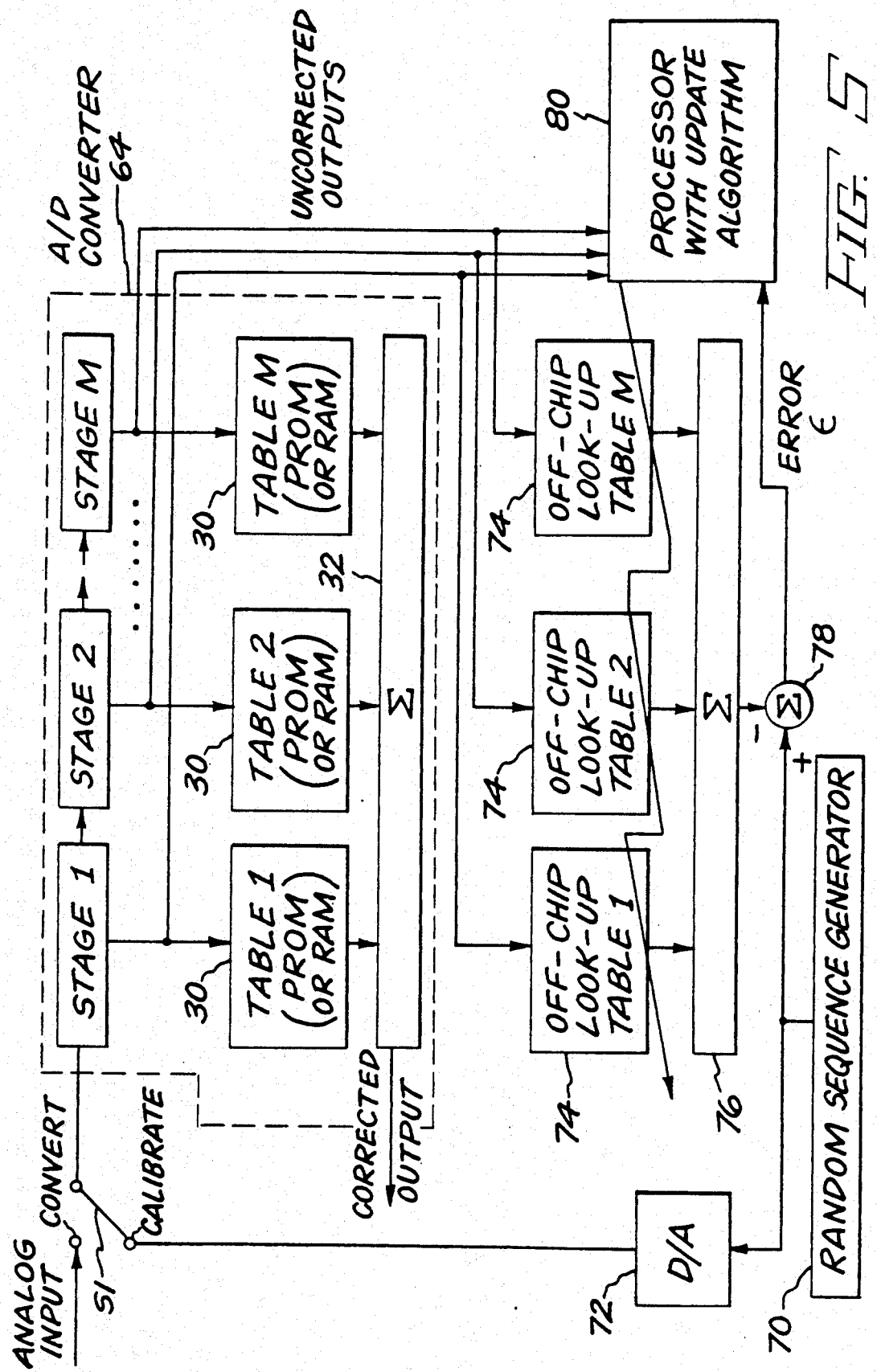
FIG. 5 is a block diagram which illustrates a calibration system for the analog-to-digital converter in accordance with the invention, which requires minimal on-chip hardware.

A system for calibrating either of these embodiments of the A/D converter during manufacture, or in applications requiring recalibration, is shown in FIG. 5. The system includes the A/D converter 64 to be calibrated (although A/D converter 64', shown in FIG. 3, may be used instead) along with an external "gold-standard" reference A/D or D/A converter, external look-up tables (or memory blocks) and a processor. When convergence is attained, the external coefficients can be programmed into a programmable ROM (PROM) or electronically erasable PROM (EEPROM) on the A/D converter chip itself. Use of a PROM 30 is shown in the calibration system (or calibration fixture) of FIG. 5. In this system, the memory within the off-chip hardware converges to a calibrated set of coefficient values using the update algorithm, i.e., the table look-up LMS algorithm described earlier. The advantage of using this technique is that the on-chip circuitry for calibration is kept to a minimum. In environments where substantial changes in circuit operating conditions due to variations in power supply levels or temperature could put a corrected A/D converter out of specification, the calibration circuitry of FIGS. 4(a), 4(b) or 5 must be included along with the A/D converter to permit periodic recalibration.

As indicated in FIG. 5, multi-stage analog-to-digital converter 64 (though analog-to-digital converter 64' may be used in the same way instead) is placed in a calibration fixture which includes a random sequence generator 70 for supplying a random binary signal to a "gold standard" digital-to-analog converter 72 wherein the binary signal is converted into an analog signal. The output analog signal from D/A converter 72 is applied via a switch S1 to the analog input of multi-stage analog-to-digital converter 64. The uncorrected output signals from each stage of the multi-stage analog-to-digital converter are applied to a set of external look-up tables 74 which correspond to look-up tables 30 in the conversion stages of multi-stage analog-to-digital converter 64. The external look-up tables 74 produce binary signals or coefficients which are combined by a summation unit 76 to produce a binary output signal. A digital subtractor 78 computes the difference between the binary signal generated by random sequence generator 70 and the binary output signal from summation unit 76 and produces an error signal $\epsilon$ representing the difference between the latter two binary signals. Error signal $\epsilon$ is applied to a processor 80, or to a finite state machine (not shown), which performs an update algorithm to correct the coefficients in look-up tables 74 until error signal $\epsilon$ is reduced to a level close to zero. At that time, the coefficients stored in external look-up tables 74 are stored in the internal look-up tables 30 of multi-stage analog-to-digital converter 64. Alternatively, the calibration fixture of FIG. 5 can employ a random analog signal generator and a "gold standard" analog-to-digital converter arranged as shown in FIG. 4B for calibration of multi-stage analog-to-digital converter 64. In either instance of course, analog-to-digital converter 64', shown in FIG. 3, may be used in the calibration system of FIG. 5 in the same manner as analog-to-digital converter 64.

The calibration circuitry can alternatively be incorporated on-chip. An oversampled D/A or A/D converter operated at a reduced conversion rate or other high precision D/A or A/D converter can be used as the "gold standard" reference. Other variations in implementation are possible and within the scope of this invention, including a configuration whereby the correction coefficients are stored externally and loaded into internal RAM after calibration. Another configuration within the scope of this invention employs a separate digital system or chip to implement the correction using PROM or RAM along with a processor or a finite state machine. This invention also encompasses discrete (i.e., circuit board level) implementations, in addition to the integrated circuit oriented approaches described herein.

Figure 6:
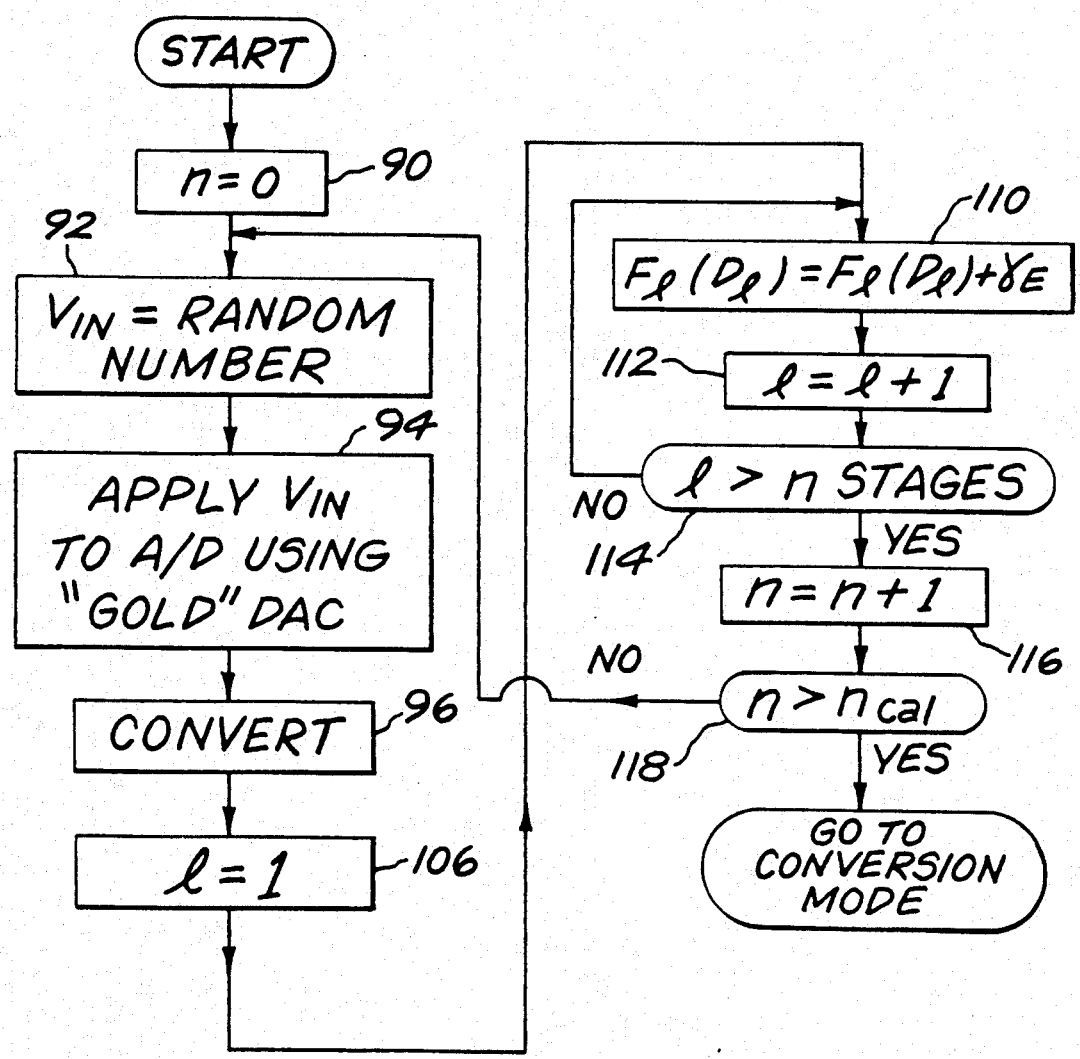
FIGS. 6 is a flow chart showing the logic of the calibrate mode of the analog-to-digital converter in accordance with the invention.

The logic of the calibration process is shown in the flow chart of FIG. 6 for the A/D converter 64 of FIG. 2. The process described is for the calibration system illustrated in FIG. 4A. The process starts by resetting an n register in multi-stage A/D converter 64 at step 90. This is a register that keeps track of the number of calibration cycles performed. A voltage $V_{in}$ is then generated by first inputting a random number to "gold standard" D/A converter 40 from random sequence generator 48 at step 92, and this random number is supplied by D/A converter 40 to A/D converter 64 at step 94. The analog-to-digital process is initiated at step 96. At the completion of this process, the 1 register is set to 1 at step 106. Now, the error $\epsilon$ in the converted output signal is determined as the difference between $V_{in}$ and $V_{A/D}$ by subtractor 52 (shown in FIG. 4A) or subtractor 78 (shown in FIG. 5). The corrected coefficient for the $1^{th}$ table is generated at step 110 as the sum of the output signal of the $1^{th}$ table for an input address of $D_1$ and a change in the error, $\gamma\epsilon$, and the 1 register is then incremented by one at step 112. This process continues until 1 is greater than $n_{stages}$, the number of stages of the pipelined A/D converter, as determined at step 114. At this point, the n register is incremented by one at step 116.

A test is next made at step 118 to determine if the content of the n register is greater than the number of calibration cycles. If not, the process loops back to step 92 and the process repeats. When the n register content exceeds the number of calibration cycles, the calibration process is complete.

What happens next depends on the context in which the A/D converter is being calibrated. If calibration is being performed during manufacture using external hardware, as shown in FIG. 5, then the calibration coefficients must subsequently be programmed into the internal look-up tables of the A/D converter 64 (or 64'). If the calibration hardware is incorporated in a system together with the A/D converter itself, then the next step is to transfer coefficients to internal A/D converter look-up tables if external tables were used. Once this is done, in either situation, the A/D converter is ready for normal signal conversion operation.

Test Data or Reduction to Practice

A computer program for high-level simulation of subranging A/D converters was written to validate the architecture and calibration method described herein. Nonidealities such as component mismatch, voltage offsets and gain errors can be incorporated as well as nonlinearities of interstage gain amplifiers. As a test case, the earlier example of a three-stage pipeline with $n_1=n_2=5$, $n_3=4$ and $G_1=G_2=16$ was simulated. It has 14 uncorrected bits resulting from its analog input signal and was expected to produce a 12-bit corrected output signal based on the choice of interstage gains. A simulation with 2% component mismatches, 10 mV offsets, and 2% nonlinearities, was corrected to yield a worst case integral nonlinearity of 1 LSB. Total signal-to-noise ratio plus signal-to-harmonic distortion ratio using a fast Fourier transform (FFT) sine wave test was 70.9 dB. This simulation approaches an ideal 12-bit performance and, in fact, without the 2% nonlinearities, an ideal performance was obtained.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A multi-stage pipelined subranging analog-to-digital converter, comprising:
   a plurality of cascade-coupled conversion stages, each of said stages including first means responsive to an analog input signal for generating a binary conversion signal corresponding to the nearest guantized level below that of the analog input signal, second means responsive to said binary conversion signal for generating a quantized analog signal corresponding tot he nearest quantized level below that of the analog input signal, third means for subtracting the quantized analog signal from the analog input signal to generate a residual analog signal for application to the next conversion stage, and a look-up table for generating a compensated binary signal selected by said binary conversion signal, said look-up table being coupled to the output of said first means by circuit means in the final stage of said converter and by delay means introducing incrementally larger delays in each successive earlier stage, respectively; and
   means for combining said compensated binary signals from said look-up tables into a binary output signal.

2. The analog-to-digital converter of claim 1 wherein each of said look-up tables comprises memory means for storing compensated binary signals adjusted to compensate for nonidealities in components of said conversion stages.

3. The analog-to-digital converter of claim 1 including:
   a separate interstage amplifier located, respectively, between each set of successive conversion stages, respectively, the gain of each of said amplifiers being less than $2^{ni}$ where $n_i$ is the number of bits in the binary conversion signal of each stage preceding a respective one of said amplifiers.

4. The analog-to-digital converter of claim 3 wherein, in each conversion stage, the look-up table includes a number of binary address inputs equal to the number $n_i$ of bits of said first means in said each conversion stage and contains $2^{ni}$ coefficients.

5. A multi-stage, pipelined subranging analog-to-digital converter, comprising:
   a plurality of cascade-coupled conversion stages, each of said stages including first means responsive to an analog input signal for generating a binary conversion signal corresponding to the nearest quantized level below that of the analog input signal, second means responsive to said binary conversion signal for generating a quantized analog signal corresponding to the nearest quantized level below that of the analog input signal, third means for subtracting the quantized analog signal from the analog input signal to generate a residual analog signal for application to the next conversion stage, and a look-up table for generating a compensated binary signal selected by said binary conversion signal, said look-up table including a number of binary address inputs equal to the number $n_i$ of bits of said first means in said each conversion stage, said binary word size of each coefficient in said look-up table being greater than the total number of bits $n_i$ of said first means in said each conversion stage to facilitate correction and calibration of said analog-to-digital converter;
   a separate interstage amplifier located, respectively, between each set of successive conversion stages, respectively, the gain of each of said amplifiers being less than $2^{ni}$ where $n_i$ is the number of bits in the binary conversion signal of each stage preceding a respective one of said amplifiers; and means for combining said compensated binary signals from said look-up tables into a binary output signal.

6. A multi-stage, pipelined subranging analog-to-digital converter comprising:
- a plurality of cascade-coupled conversion stages, each of said stages including first means responsive to an analog input signal for generating a binary conversion signal corresponding to the nearest quantized level below that of the analog input signal, second means responsive to said binary conversion signal for generating a quantized analog signal corresponding to the nearest quantized level below that of the analog input signal, and third means for subtracting the quantized analog signal from the analog input signal to generate a residual analog signal for application to the next conversion stage;
- a common look-up table for at least a predetermined number of most significant bit conversion stages for generating a compensated binary signal selected by said binary conversion signals of said most significant bit stages;
- a separate look-up table for each respective one of the conversion stages not included within said predetermined number, for generating a compensated binary signal selected by said binary conversion signal of each respective one of said conversion stages not included within said predetermined number; and
- means for combining said compensated binary signals from said common look-up table and said separate look-up tables into a binary output signal.

7. The multi-stage, pipelined subranging analog-to-digital converter of claim 6 including;
- a separate interstage amplifier located, respectively, between each set of successive conversion stages, respectively, the gain of each of said amplifiers being less than $2^{n_i}$ where $n_i$ is the number of bits in the binary conversion signal of each stage preceding a respective one of said amplifiers.

8. A multi-stage, pipelined subranging analog-to-digital converter, comprising:
- a plurality of cascade-coupled conversion stages, each of said stages including an analog-to-digital converter for converting an analog input signal into a binary conversion signal corresponding to the nearest quantized level below that of the analog input signal, a digital-to-analog converter for converting said binary conversion signal into a quantized analog signal corresponding to the nearest quantized level below that of the analog input signal, summation means for subtracting the quantized analog signal from the analog input signal to generate a residual analog signal for application to the next conversion stage, an interstage amplifier coupling said each of said stages to the next successive conversion stage, the gain of said amplifier being less than $2^{n_i}$ where n is the number of bits in the binary conversion signal of said each of said stages, and a look-up table for generating a compensated binary signal selected by said binary conversion signal, said look-up table having $n_i$ binary address inputs and $2^{n_i}$ coefficients and
- wherein, in said each conversion stage, binary word size of each coefficient in said look-up table is greater than the total number of bits $n_i$ of the analog-to-digital converter therein to facilitate correction and calibration of said multi-stage, pipelined subranging analog-to-digital converter; and
- means for combining said compensated binary signals from the look-up tables into a binary output signal.

9. A multi-stage, pipelined subranging analog-to-digital converter comprising:
- a plurality of cascade-coupled conversion stages, each of said stages including an analog-to-digital converter for converting an analog input signal into a binary conversion signal corresponding to the nearest quantized level below that of the analog input signal, a digital-to-analog converter for converting said binary conversion signal into a quantized analog signal corresponding to the nearest quantized level below that of the analog input signal, summation means for subtracting the quantized analog signal from the analog input signal to generate a residual analog signal for application to the next conversion stage, an interstage amplifier coupling said each of said stages to the next successive conversion stage, the gain of said amplifier being less than $2^{n_i}$ where $n_i$ is the number of bits in the binary conversion signal of said each of said stages;
- a plurality of look-up tables for generating a compensated binary signal selected by said binary conversion signal, a first of said look-up tables being coupled to a plurality of said stages producing the most significant bits, and at least a separate look-up table being coupled to the stage producing the least significant bit; and
- means for combining said compensated binary signals from the look-up tables into a binary output signal.

10. The multi-stage, pipelined subranging analog-to-digital converter of claim 9 wherein, in said each conversion stage, the look-up table coupled thereto comprises memory means for storing compensated binary output signals selected to compensate for nonidealities in components of said each conversion stage.

11. The multi-stage, pipelined subranging analog-to-digital converter of claim 9 wherein, in said each conversion stage, binary word size of each coefficient in said look-up table is greater than the total number of bits of the analog-to-digital converters coupled thereto to facilitate correction and calibration of said multi-stage, pipelined subranging analog-to-digital converter.

12. The multi-stage, pipelined subranging analog-to-digital converter of claim 9 including at least a third look-up table coupled to the stages subsequent to said plurality of said stages producing the most significant bits.

13. A digital calibration system for a multi-stage, pipelined subranging analog-to-digital converter, said converter including a plurality of cascade-coupled conversion stages, each of said stages including an analog-to-digital conversion signal corresponding to the nearest quantized level below that of the analog input signal, a digital-to-analog converter for converting said binary conversion signal into a quantized analog signal corresponding to the nearest quantized level below that of the analog input signal, summation means for subtracting the quantized analog signal from the analog input signal to generate a residual analog signal for application to the next conversion stage, and a look-up table for generating a compensated binary signal selected by said binary conversion signal, said converter further including means for combining the compensated binary signals from the look-up tables in each of said stages into a binary output signal, said digital calibration system comprising:

- a plurality of calibration look-up tables corresponding, respectively, to the look-up tables of the analog-to-digital converter conversion stages;
- means for applying an analog input signal to the multi-stage analog-to-digital converter;
- means for applying the binary conversion signals from the analog-to-digital converters of said conversion stages to said calibration look-up tables;
- means for combining the compensated binary signals from said calibration look-up tables into a binary calibration signal;
- means for comparing the binary calibration signal with another binary signal corresponding to the analog input signal applied to the multi-stage analog-to-digital converter, to produce an error signal; and
- means responsive to the error signal for correcting the compensated binary signals stored in said calibration look-up tables.

14. The digital calibration system of claim 13 including means for writing memory data from the calibration look-up tables into the look-up tables of the multi-stage analog-to-digital converter after calibration is completed.

15. The digital calibration system of claim 13 including:

- a random sequence generator for generating, as said another binary signal, a binary signal which is compared with the binary calibration signal; and
- means for converting said random binary signal into said analog input signal applied to the multi-stage analog-to-digital converter.

16. The digital calibration system of claim 13 including:

- a random signal generator for generating a random analog signal for application to the multi-stage analog-to-digital converter as said analog input signal; and
- means for converting said random analog signal into said another binary signal for comparison with said binary calibration signal.

17. The digital calibration system of claim 13 wherein said means responsive to the error signal comprises a processor further responsive to the binary conversion signal from each stage of the multi-stage analog-to-digital converter for correcting the compensated binary signals stored in said calibration look-up tables and storing the corrected compensated binary signals in said look-up tables of the multi-stage analog-to-digital converter.

18. A digital calibration system for a multi-stage, pipelined subranging analog-to-digital converter, said converter including a plurality of cascade-coupled conversion stages, each of said stages including an analog-to-digital converter for converting an analog input signal into a binary conversion signal corresponding to the nearest quantized level below that of the analog input signal, a digital-to-analog converter for converting said binary conversion signal into a quantized analog signal corresponding to the nearest quantized level below that of the analog input signal, and summation means for subtracting the quantized analog signal from the analog input signal to generate a residual analog signal for application to the next conversion stage, said converter further including a plurality of look-up tables for generating a compensated binary signal selected by those of the binary conversion signals respectively supplied thereto, and means for combining the compensated binary signals from the look-up tables into a binary output signal, said digital calibration system comprising:

- a plurality of calibration look-up tables corresponding, respectively, to the look-up tables of the analog-to-digital converter;
- means for applying an analog input signal to the multi-stage analog-to-digital converter;
- means for applying the binary conversion signals from the analog-to-digital converters of said conversion stages to said calibration look-up tables;
- means for combining the compensated binary signals from said calibration look-up tables into a binary calibration signal;
- means for comparing the binary calibration signal with another binary signal corresponding to the analog input signal applied to the multi-stage analog-to-digital converter, to produce an error signal; and
- means responsive to the error signal for correcting the compensated binary signals stored in said calibration look-up tables.

19. The digital calibration system of claim 18 including means for writing memory data from the calibration look-up tables into the look-up tables of the multi-stage analog-to-digital converter after calibration is completed.

20. The digital calibration system of claim 18 including

- a random sequence generator for generating, as said another binary signal, a binary signal which is compared with the binary calibration signal; and
- means for converting said random binary signal into said analog input signal applied to the multi-stage analog-to-digital converter.

21. The digital calibration system of claim 18 including:

- a random signal generator for generating a random analog signal for application to the multi-stage analog-to-digital converter as said analog input signal; and
- means for converting said random analog signal into said another binary signal for comparison with said binary calibration signal.

22. The digital calibration system of claim 18 wherein said means responsive to the error signal comprises a processor further responsive to the binary conversion signal from the multi-stage analog-to-digital converter for correcting the compensated binary signals stored in said calibration look-up tables and storing the corrected compensated binary signals in said look-up tables of the multi-stage analog-to-digital converter.

* * * * *